United States Patent
Kato et al.

[11] Patent Number: 5,949,120
[45] Date of Patent: *Sep. 7, 1999

[54] SEMICONDUCTOR PHOTODETECTOR

[75] Inventors: Kazutoshi Kato; Yoshifumi Muramoto; Osaake Nakajima; Masahiro Yuda, all of Kanagawa; Atsuo Kozen, Tokyo, all of Japan

[73] Assignee: Nippon Telegraph and Telephone Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/805,497

[22] Filed: Feb. 26, 1997

[30] Foreign Application Priority Data

Feb. 28, 1996 [JP] Japan ................................... 8-040892
Oct. 16, 1996 [JP] Japan ................................... 8-273147
Dec. 17, 1996 [JP] Japan ................................... 8-336494

[51] Int. Cl.$^6$ ..................... H01L 31/06; H01L 31/0232
[52] U.S. Cl. ................................ 257/461; 257/436
[58] Field of Search ....................... 257/461, 436, 257/615

[56] References Cited

U.S. PATENT DOCUMENTS 5,006,906  4/1991  Deri .............................. 357/16
5,316,593  5/1994  Olson et al. .
5,376,185  12/1994  Wanlass .

FOREIGN PATENT DOCUMENTS 4-268770  9/1992  Japan .
8-18089   1/1996  Japan .
2253480   3/1991  United Kingdom ............. G01J 1/02

OTHER PUBLICATIONS

Muller et al, *Device Electronics for IC's*, pp. 179–180. 1986.
Spectrally Selective Waveguide Photodetector, Soviet Technical Physics Letters, USA, vol. 6, No. 10, Oct. 1980, pp. 529–530.
A High–Efficiency 50 GHZ Ingaas Multimode Waveguide Photodetector, IEEE Journal of Quantum Electronics, vol. 28, No. 12, Dec. 1, 1992, pp. 2728–2735.

*Primary Examiner*—Stephen D. Meier
*Attorney, Agent, or Firm*—Blakely Sokoloff Taylor & Zafman

[57] ABSTRACT

This semiconductor photodetector includes a photoabsorption layer, an n-type first semiconductor layer, and a p-type second semiconductor layer. The photoabsorption layer comprises an n-type first layer and a p-type second layer formed in contact with the first layer. The first semiconductor layer is arranged on the side of the first layer and has a shorter wavelength at a light absorption edge and a lower refractive index than in the photoabsorption layer. The second semiconductor layer is arranged on the side of the second layer and has a shorter wavelength at a light absorption edge and a lower refractive index than in the photoabsorption layer. When a predetermined reverse bias voltage is applied between the first and second semiconductor layers, the first layer is entirely depleted and the second layer is partially depleted.

6 Claims, 5 Drawing Sheets

SEMICONDUCTOR PHOTODETECTOR

BACKGROUND OF THE INVENTION

The present invention relates to a semiconductor photodetector and, more particularly, to a semiconductor waveguide photodetector.

Figure 5:
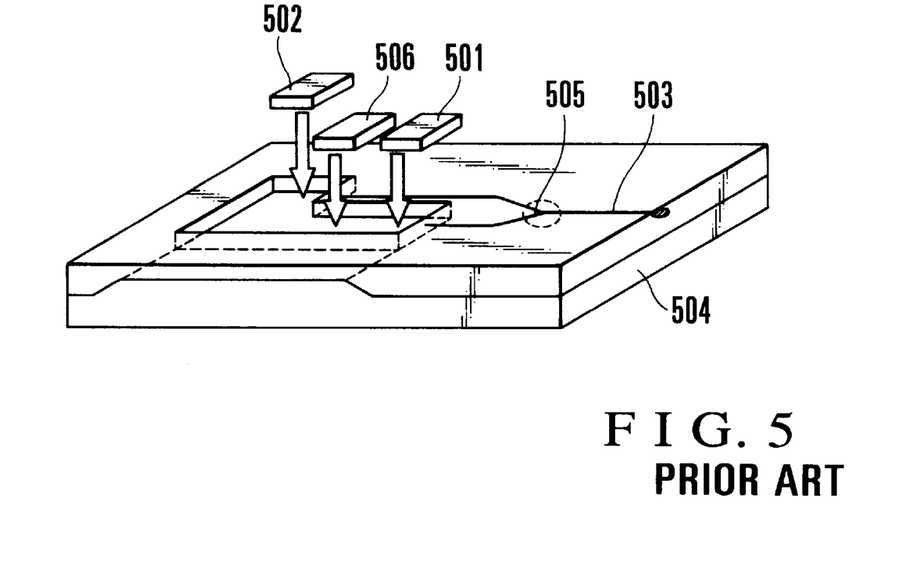
FIG. 5 is a perspective view showing the structure of an integrated transmitting/receiving apparatus for optical communication.

Recently, replacing the existing electric cables with optical communication cables as subscriber communication means is being examined. In doing this, the largest technical difficulty is to inexpensively provide small-sized, highly reliable subscriber transmitting/receiving apparatuses. Also, in conventionally proposed transmitting/receiving apparatuses, it is being attempted to integrally form a light-emitting device 501, a photodetector 502, and an optical waveguide 503 on a single substrate 504, as shown in FIG. 5, in addition to miniaturizing electronic circuits by using ICs and reducing the consumption power. To integrally form these devices on the substrate 504 on which the optical waveguide 503 having an optical branch circuit 505 is formed, it is important to form waveguide structures in both the light-emitting device 501 and the photodetector 502. Note that reference numeral 506 in FIG. 5 denotes a monitoring photodiode.

Figure 6:
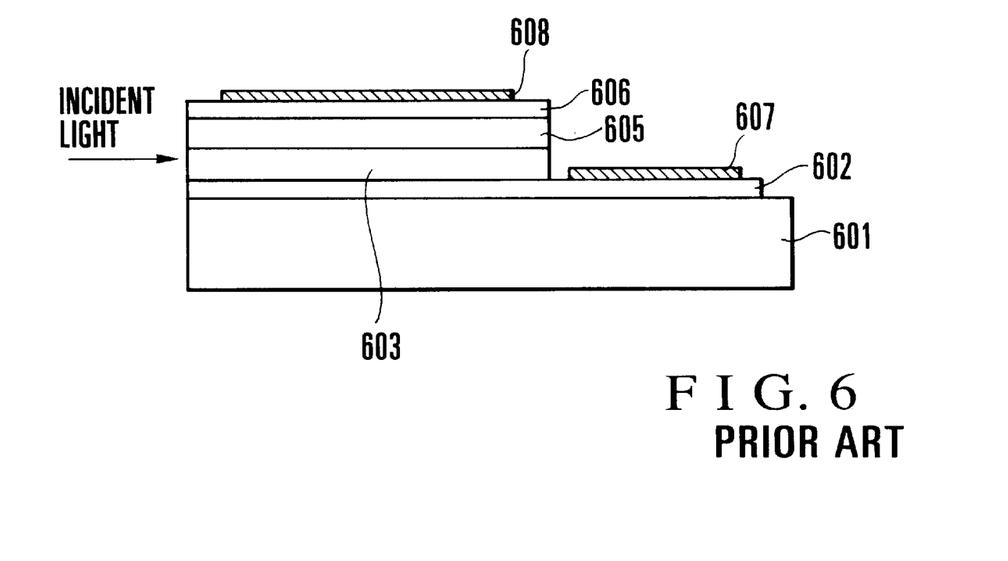
FIG. 6 is a sectional view showing the structure of a conventional waveguide type semiconductor photodetector.

As a photodetector having this waveguide structure, a semiconductor waveguide photodetector shown in FIG. 6 is being studied since this photodetector is suited to a high-speed operation.

In this semiconductor waveguide photodetector, a 0.6-$\mu$m thick n-type InGaAsP optical guide layer 602 having a band gap wavelength of 1.3 $\mu$m is formed on a semi-insulating InP substrate 601. In a predetermined region on this optical guide layer 602, a 0.6-$\mu$m thick n-type InGaAs photoabsorption layer 603 with a low carrier density is formed. A 0.6-$\mu$m thick p-type InGaAsP optical guide layer 605 having a band gap wavelength of 1.3 $\mu$m is formed on the photoabsorption layer 603. A 0.5-$\mu$m thick p-type InP cladding layer 606 is formed on the optical guide layer 605.

An n-type ohmic electrode 607 is formed on a region where the photoabsorption layer 603 on the optical guide layer 602 is not formed. A p-type ohmic layer 608 is formed on the cladding layer 606 (K. Kato et al., "A. high-efficiency 50 GHz InGaAs multimode waveguide photodetector", IEEE Journal of Quantum Electronics Vol. 28, No. 12, p. 2728, 1992).

The principle of the operation of this semiconductor photodetector shown in FIG. 6 is as follows. Incident light with a wavelength of 1.55 $\mu$m incident from the cleavage surface is guided in an optical waveguide constituted by the substrate 601, the optical guide layer 602, the photoabsorption layer 603, the optical guide layer 605, and the cladding layer 606. While being guided in the optical waveguide, the incident light is absorbed by the photoabsorption layer 603 and converted into electrons and holes (O/E conversion). These electrons and holes produced by the O/E conversion are made run to the n- and p-type semiconductor layers, respectively, by an electric field generated by a reverse bias voltage applied to the pn-junction, and are extracted out from the device as a signal current.

In providing a small-sized, high-reliability transmitting/receiving apparatus at a low cost as described previously, a light-emitting device has no problem. However, when a waveguide photodetector is used as the photodetector for a subscriber transmitting/receiving apparatus, the following problems arise.

First, in the subscriber transmitting/receiving apparatus, it is necessary to simultaneously realize miniaturization of electronic circuits and reduction of consumption power. To this end, integrated circuits driven with a lower voltage must be used, so the driving voltages of a light-emitting device and a photodetector are lowered accordingly. Also, the voltage to be applied to a photodetector must be 2 V or less which is used in low-consumption-power integrated circuits, and is preferably 1 V.

Even a photodetector like this is naturally required to have a high O/E conversion efficiency (to be simply referred to as an efficiency hereinafter) and a high operating speed.

The semiconductor waveguide photodetector as shown in FIG. 6 has an optical waveguide structure and is in this respect suited to the integration of a transmitting/receiving apparatus necessary to realize optical communication in the subscriber system.

On the other hand, this semiconductor waveguide photodetector has a very high operating speed reaching 50 GHz, so the application to a large-capacity, high-speed transmission system used between switching systems has been exclusively examined. Therefore, as will be described below, the response speed is decreased when the driving voltage is lowered, and this makes this photodetector unsuited to miniaturize electronic circuits in the transmitting/receiving apparatus and reduce the consumption power of the apparatus.

First, the thickness of the photoabsorption layer must be 2 $\mu$m or more for the reasons explained below. In receiving an optical signal about 10 $\mu$m in diameter supplied through an optical fiber by using a semiconductor waveguide photodetector with a finite length, the efficiency of O/E conversion can be increased as the thickness of the photoabsorption layer increases. Additionally, in a semiconductor waveguide photodetector, to decrease the capacitance and allow an input optical signal (diameter=about 10 $\mu$m) from an optical fiber to be efficiently coupled with an optical guide, the optical waveguide including the photoabsorption layer is so processed as to have a mesa structure (or a ridge structure) having a width of about 30 $\mu$m. Furthermore, to decrease the capacitance to a desired small value, the length of the optical waveguide including the photoabsorption layer must be further decreased.

For the reasons as above, when the photoabsorption layer is thinned, signal light can no longer be well absorbed by the photoabsorption layer. When the device length is 100 $\mu$m, for example, the efficiency of O/E conversion depending upon the thickness of this photoabsorption layer is 90% for a 3-$\mu$m thick photoabsorption layer and 75% for a 2-$\mu$m thick photoabsorption layer. To use the photoabsorption layer as a photodetector, an efficiency of 70% or more is necessary. Therefore, the thickness of the photoabsorption layer must be 2 $\mu$m or more.

On the other hand, in a semiconductor waveguide photodetector, the photoabsorption layer is generally made have as a low carrier density as possible, e.g., an n-type low carrier density of about $1\times10^{15}$ cm$^{-3}$, for the sake of crystal growth. This is to deplete the photoabsorption layer as much as possible with an applied bias voltage and allow carriers (electrons and holes) generated by O/E conversion to run at a high speed.

Figure 7:
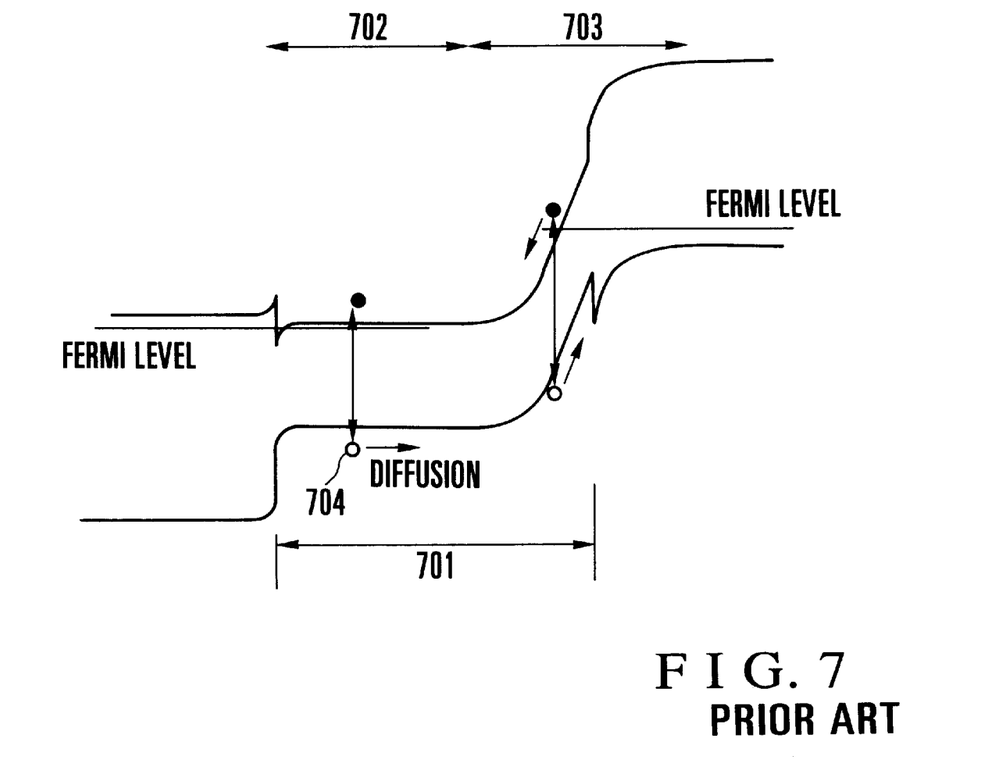
FIG. 7 is a band diagram of a conventional semiconductor waveguide photodetector.

The present inventors, however, have found the following problem. As shown in FIG. 7, with a low bias voltage of about 1 V, for example, a photoabsorption layer 701 having a carrier density of about $1\times10^{15}$ cm$^{-3}$ is depleted only to about 1.5 $\mu$m. Consequently, in a device in which the thickness of the photoabsorption layer 701 is 3 $\mu$m, an n-type layer 702 about 1.5 $\mu$m thick remains in the photoabsorption layer 701 without being depleted. A hole 704 generated by O/E conversion slowly moves in this n-type layer 702 due to carrier diffusion and then enters a depleted region 703. Accordingly, in this state, it is impossible to respond to a high-speed signal of 10 MHz or higher.

In summary, in the conventional semiconductor waveguide photodetectors, the thickness of the photoabsorption layer must be increased to, e.g., 3 µm in order to raise the efficiency of O/E conversion. However, if the thickness of the photoabsorption layer is thus increased, it becomes impossible to respond to high-speed optical signals. That is, when the conventional semiconductor photodetector as described above is used as a photodetector of a subscriber transmitting/receiving apparatus, it is difficult to simultaneously accomplish a high efficiency and a high operating speed.

SUMMARY OF THE INVENTION

It is, therefore, a principal object of the present invention to provide a semiconductor photodetector capable of responding to a high-speed optical signal without decreasing the O/E conversion efficiency even when driven with a low voltage of about 1 V.

To achieve the above object, according to one aspect of the present invention, there is provided a semiconductor photodetector comprising a photoabsorption layer having an n-type first layer and a p-type second layer formed in contact with the first layer, an n-type first semiconductor layer arranged on the side of the first layer and having a shorter wavelength at a light absorption edge and a lower refractive index than in the photoabsorption layer, and a p-type second semiconductor layer arranged on the side of the second layer and having a shorter wavelength at a light absorption edge and a lower refractive index than in the photoabsorption layer, wherein when a predetermined reverse bias voltage is applied between the first and second semiconductor layers, the first layer is entirely depleted and the second layer is partially depleted.

In this structure, the first layer is entirely depleted when a predetermined voltage is applied, and this increases the moving velocity of even holes. Additionally, although the p-type second layer is not entirely depleted, photo-excited carriers contributing to O/E conversion are electrons as minority carriers. Therefore, the response speed of the semiconductor photodetector is increased by a very high diffusion rate of the electrons.

According to another aspect of the present invention, the wavelength at a light absorption edge of the second layer decreases away from the first layer in the direction of thickness.

In this structure, the gradient of a band gap is formed in the second layer. This can make the velocity at which carriers (electrons) move to the first layer higher than the diffusion rate of the electrons.

According to still another aspect of the present invention, the impurity density in the second layer increases away from the first layer in the direction of thickness.

In this structure, an electric field is formed by the gradient of the impurity density even in an undepleted region of the second layer. This can make the velocity at which carriers (electrons) move to the first layer higher than the diffusion rate of the electrons.

According to still another aspect of the present invention, side surfaces except a light incident end face of the second layer are covered with a third layer of n-type made from the same material as the second layer, side surfaces except the light incident end face of the second semiconductor layer are covered with a fourth layer of n-type made from the same material as the second semiconductor layer, and the second layer and the second semiconductor layer are gradually widened in a light guiding direction from the light incident end face.

This structure can be manufactured easily.

DESCRIPTION OF THE PREFERRED EMBODIMENTS

Embodiments of the present invention will be described in detail below with reference to the accompanying drawings.

First Embodiment

Figure 1A:
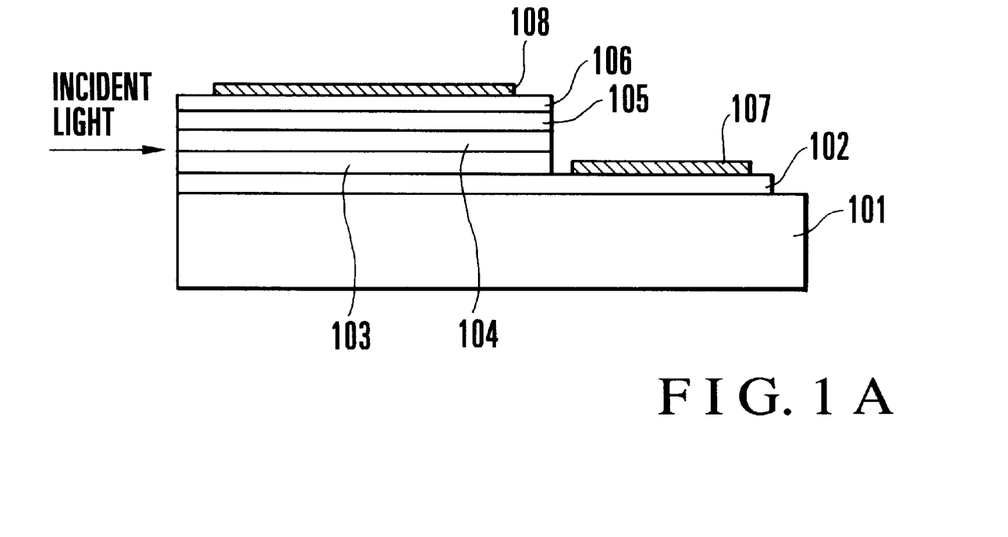
FIGS. 1A and 1B are a sectional view and a band diagram, respectively, showing the structure of a semiconductor photodetector according to the first embodiment of the present invention.
Figure 1B:
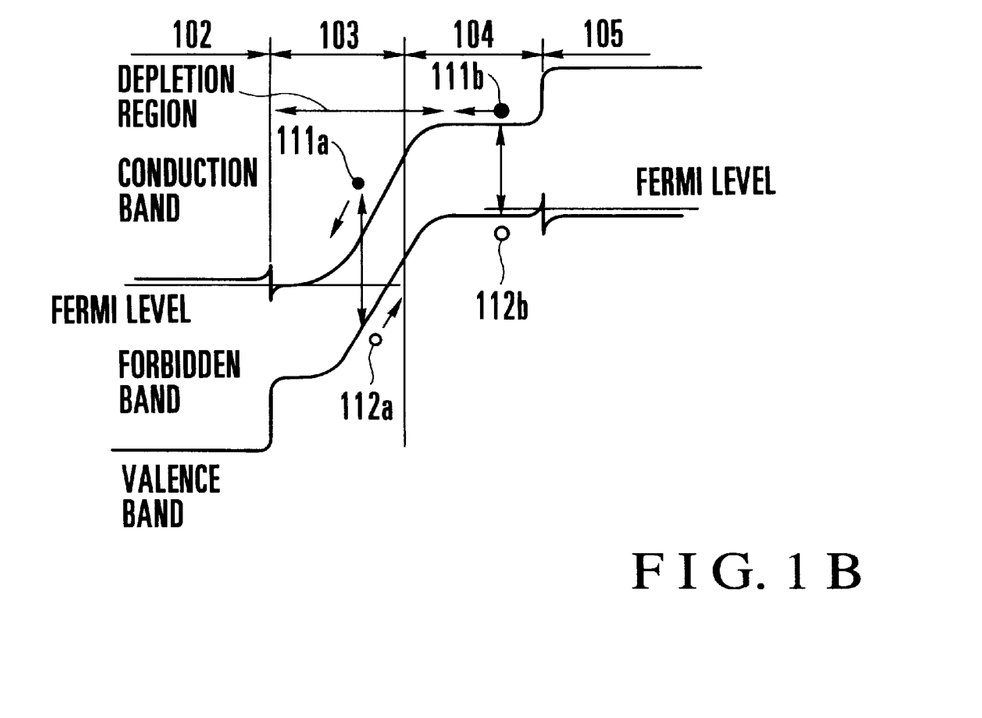

FIGS. 1A and 1B show the structure of a semiconductor photodetector according to the first embodiment of the present invention.

In this first embodiment, as shown in FIG. 1A, a 2-µm thick n-type InGaAsP optical guide layer 102 having a band gap wavelength of 1.2 µm is formed on a substrate 101 which is an Fe-doped semi-insulating InP cladding layer. This optical guide layer 102 is made an n-type by doping silicon at a density of $10^{18}$ cm$^{-3}$.

In a predetermined region on the optical guide layer 102, a 1.5-µm thick n-type InGaAsP lower photoabsorption layer 103 having a band gap wavelength of 1.4 µm and a low carrier density is formed. A 1.5-µm thick p-type InGaAsP upper photoabsorption layer 104 having a band gap wavelength of 1.4 µm is formed on top of the lower photoabsorption layer 103. Note that although no impurity is doped into the lower photoabsorption layer 103, the layer 103 contains a very small amount of silicon at a density of $10^{15}$ cm$^{-3}$ and as a consequence the layer 103 is of an n-type. The upper photoabsorption layer 104 is made a p-type by doping Zn as an impurity at a density of $10^{18}$ cm$^{-3}$.

On the upper photoabsorption layer 104, a 2-µm thick p-type InGaAsP optical guide layer 105 having a band gap wavelength of 1.2 µm and doped with Zn as an impurity at a density of $10^{18}$ cm$^{-3}$ is formed. On the optical guide layer 105, a 0.5-µm thick p-type InP cladding layer 106 doped with Zn as an impurity at a density of $10^{18}$ cm$^{-3}$ is formed.

Additionally, an n-type ohmic electrode 107 is formed in a region on the optical guide layer 102 where no photoabsorption layer is formed, and a p-type ohmic electrode 108 is formed on the cladding layer 106.

In this semiconductor waveguide photodetector, the optical guide layer 102, the lower photoabsorption layer 103, the upper photoabsorption layer 104, the optical guide layer 105, and the cladding layer 106 form a ridge structure 100 µm long and 30 µm wide.

A band structure from the optical guide layer 102 to the optical guide layer 105 in the above structure is as shown in a band diagram of FIG. 1B.

In a state shown in FIG. 1B, incident light with a wavelength of 1.3 µm incident from the end face is gradually O/E-converted by the lower and upper photoabsorption layers 103 and 104 while being guided in the waveguide photodetector, generating electrons 111a and 111b and holes 112a and 112b.

The electrons 111a and 111b move toward the optical guide layer 102, and the hole 112a moves toward the upper photoabsorption layer 104. The hole 112b, on the other hand, disappears when coupling with one of electrons barely existing due to thermal excitation in the p-type upper photoabsorption layer 104.

The hole 112a and the electron 111a produced by photoabsorption in the depleted lower photoabsorption layer 103 reach the upper photoabsorption layer 104 and the optical guide layer 102, respectively. The electron 111b produced by photoabsorption in the upper photoabsorption layer 104 where electrons are minority carriers passes through the lower photoabsorption layer 103 and reaches the optical guide layer 102. That is, electrons and holes pass through the depleted layer, and this generates an O/E-converted current.

In the semiconductor waveguide photodetector of this first embodiment, a depleted layer extends from the upper photoabsorption layer 104 into the lower photoabsorption layer 103. Since the thickness of the lower photoabsorption layer 103 is 1.5 µm, the whole layer is depleted even with an applied voltage of 1 V. Accordingly, carriers contributing to the O/E-converted current produced by O/E conversion in the lower photoabsorption layer 103 move at a drift speed and can respond at a high speed.

Additionally, the upper photoabsorption layer 104 is made from a p-type semiconductor. Therefore, the response of the electron 111b contributing to the O/E-converted current produced by O/E conversion in the upper photoabsorption layer 104 is dominated by the diffusion rate of electrons. The diffusion rate of the electron 111b is not less than one order of magnitude higher than the diffusion rate of a hole. That is, the electron 111b moves at a high speed and can respond at a high speed.

From these two reasons described above, all carriers generated in the lower and upper photoabsorption layers 103 and 104 and contributing to the generation of O/E-converted currents are capable of high-speed response. Consequently, the semiconductor waveguide photodetector according to the first embodiment can receive optical signals of high frequencies.

In effect, the semiconductor photodetector of the first embodiment was able to receive an optical signal with a frequency of 10 GHz at an O/E conversion efficiency of 80% when applied with a bias voltage of 1 V. This O/E conversion efficiency saturated at 1 V.

In this first embodiment, the cleavage surface is used as the light incident end face. However, a similar effect can be expected even when a surface formed by etching is used as the light incident end face. Also, a semi-insulating semiconductor substrate is used in the first embodiment, but a similar effect can be expected even with the use of a conductive semiconductor substrate. If this is the case, an analogous effect can be expected even when one electrode is formed on the back surface of the semiconductor substrate.

Second Embodiment

Figure 2A:
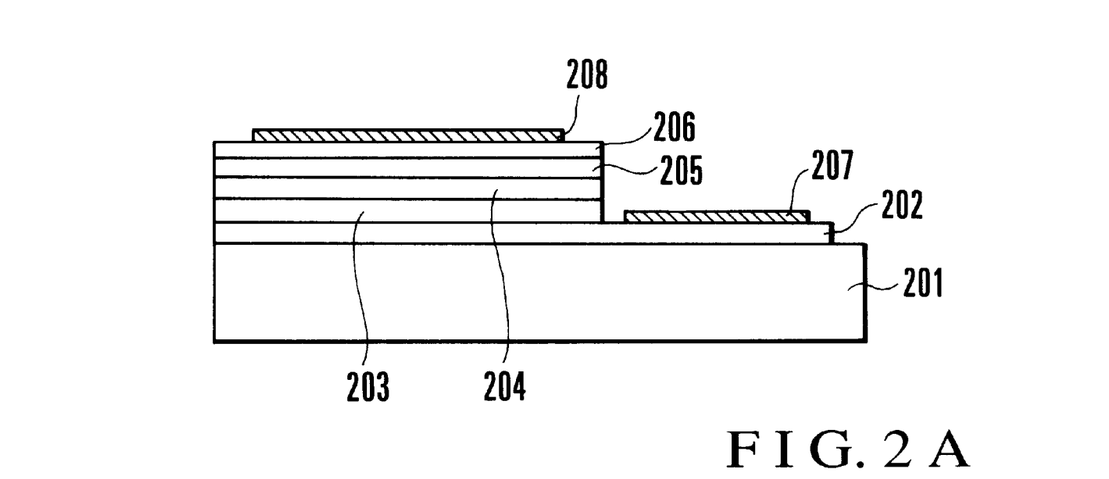
FIGS. 2A and 2B are a sectional view and a band diagram, respectively, showing the structure of a semiconductor photodetector according to the second embodiment of the present invention.
Figure 2B:
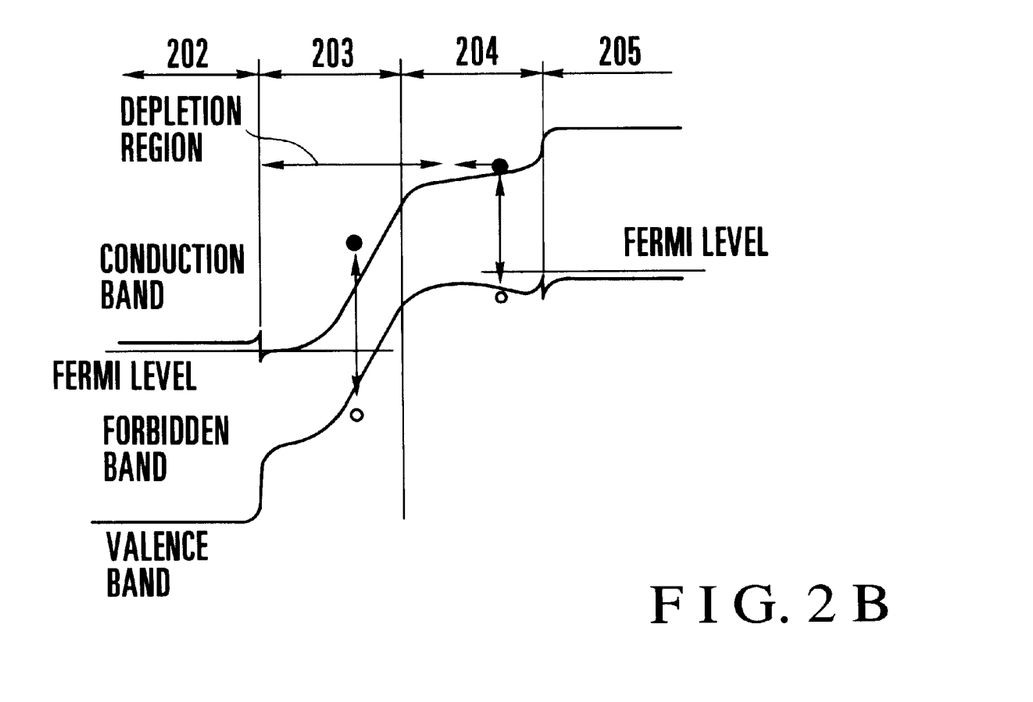

FIGS. 2A and 2B show the structure of a semiconductor photodetector according to the second embodiment of the present invention.

As shown in FIG. 2A, a 2-µm thick n-type InGaAsP optical guide layer 202 having a band gap wavelength of 1.2 µm and doped with Si as an impurity at a density of $10^{18}$ cm$^{-3}$ is formed on a substrate 201 which is an Fe-doped semi-insulating InP cladding layer.

In a predetermined region of this optical guide layer 202, a 1.5-µm thick n-type InGaAsP lower photoabsorption layer 203 having a band gap wavelength of 1.4 µm and a low carrier density is formed. Note that although no impurity is doped into the lower photoabsorption layer 203, the layer 203 contains a very small amount of silicon at a density of $10^{15}$ cm$^{-3}$ and as a consequence the layer 203 is of an n-type.

Additionally, a 1.5-µm thick p-type InGaAsP upper photoabsorption layer 204 doped with Zn as an impurity at a density of $10^{18}$ cm$^{-3}$ is formed on top of the lower photoabsorption layer 203. In this second embodiment, the band gap wavelength of the upper photoabsorption layer 204 gradually changes from 1.4 µm to 1.35 µm from the lower end to the upper end.

On the upper photoabsorption layer 204, a 2-µm thick p-type InGaAsP optical guide layer 205 having a band gap wavelength of 1.2 µm and doped with Zn as an impurity at a density of $10^{18}$ cm$^{-3}$ is formed. On the optical guide layer 205, a 0.5-µm thick p-type InP cladding layer 206 doped with Zn as an impurity at a density of $10^{18}$ cm$^{-3}$ is formed.

Additionally, an n-type ohmic electrode 207 is formed in a region of the optical guide layer 202 where no photoabsorption layer is formed, and a p-type ohmic electrode 208 is formed on the cladding layer 206.

In this semiconductor waveguide photodetector, the optical guide layer 202, the lower photoabsorption layer 203, the upper photoabsorption layer 204, the optical guide layer 205, and the cladding layer 206 form a ridge structure 100 µm long and 30 µm wide. This ridge structure has an optical waveguide structure having core layers formed by stacking the lower and upper photoabsorption layers 203 and 204.

Incident light from the cleaved end face is gradually O/E-converted by the photoabsorption layers while being guided in the waveguide photodetector.

A band structure from the optical guide layer 202 to the optical guide layer 205 in the above structure is as shown in a band diagram of FIG. 2B. In the waveguide photodetector of this second embodiment, the lower photoabsorption layer 203 has a thickness of 1.5 µm and an n-type low carrier density, so the whole layer is depleted. Accordingly, carriers produced by O/E conversion in the lower photoabsorption layer 203 move at a drift speed and can respond at a high speed.

Also, since the upper photoabsorption layer 204 is made from a p-type semiconductor, the response of carriers produced by O/E conversion is dominated by the diffusion rate of electrons. The diffusion rate of electrons is not less than one order of magnitude higher than the diffusion rate of holes, and this allows electrons to respond at a high speed. This is the same as in the waveguide photodetector according to the first embodiment described above.

Additionally, in the waveguide photodetector according to the second embodiment, the band gap wavelength of the upper optical absorption layer 204 gradually changes from 1.4 μm to 1.35 μm from the lower end to the upper end. Therefore, the gradient of a band gap is formed in the upper photoabsorption layer 204. That is, a region wherein electrons drift toward the optical guide layer 202 is also formed in the upper photoabsorption layer 204. Then, electrons as minority carriers are accelerated in the upper photoabsorption layer 204. According to this second embodiment, therefore, the response speed is higher than that in the semiconductor photodetector of the first embodiment.

In the second embodiment, the cleavage surface is used as the light incident end face as in the first embodiment. However, a similar effect can be expected even when a surface formed by etching is used as the light incident end face.

Also, a semi-insulating semiconductor substrate is used in the second embodiment, but a similar effect can be expected even with the use of a conductive semiconductor substrate. If this is the case, an analogous effect can be expected even when one electrode is formed on the back surface of the semiconductor substrate.

In the second embodiment, the improvement of the response speed has been described as the effect of gradually changing the band gap wavelength in the p-type photoabsorption region. However, gradually changing the band gap wavelength in the p-type photoabsorption region also restricts random walk of thermally excited carriers and reduces a dark current.

Third Embodiment

Figure 3A:
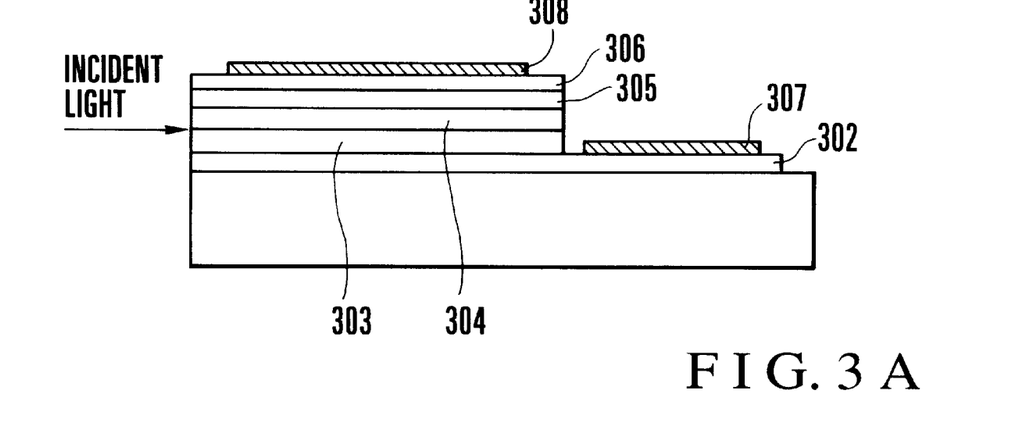
FIGS. 3A and 3B are a sectional view and a band diagram, respectively, showing the structure of a semiconductor photodetector according to the third embodiment of the present invention.
Figure 3B:
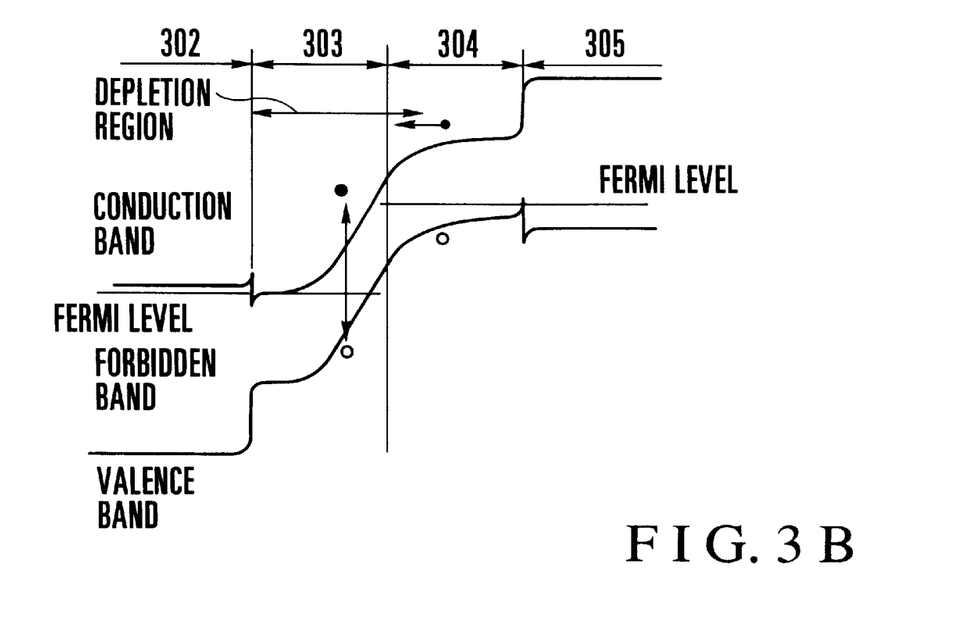

FIGS. 3A and 3B show the structure of a semiconductor photodetector according to the third embodiment of the present invention.

As shown in FIG. 3A, a 2-μm thick n-type InGaAsP optical guide layer 302 having a band gap wavelength of 1.2 μm and doped with Si as an impurity at a density of $10^{18}$ cm$^{-3}$ is formed on a substrate 301 which is an Fe-doped semi-insulating InP cladding layer.

In a predetermined region of this optical guide layer 302, a 1.5-μm thick n-type InGaAsP lower photoabsorption layer 303 having a band gap wavelength of 1.4 μm and a low carrier density is formed. Note that although no impurity is doped into the lower photoabsorption layer 303, the layer 303 contains a very small amount of silicon at a density of $10^{15}$ cm$^{-3}$ and as a consequence the layer 303 is of an n-type.

Additionally, a 1.5-μm thick p-type InGaAsP upper photoabsorption layer 304 having a band gap wavelength of 1.4 μm is formed on top of the lower photoabsorption layer 303. In the semiconductor waveguide photodetector of this third embodiment, Zn as a p-type impurity is so doped in the upper photoabsorption layer 304 that the Zn density gradually changes from $1 \times 10^{17}$ cm$^{-3}$ to $1 \times 10^{18}$ cm$^{-3}$ from the lower end to the upper end.

On the upper photoabsorption layer 304, a 2-μm thick p-type InGaAsP optical guide layer 305 having a band gap wavelength of 1.2 μm and doped with Zn as an impurity at a density of $10^{18}$ cm$^{-3}$ is formed. On the optical guide layer 305, a 0.5-μm thick p-type InP cladding layer 306 doped with Zn as an impurity at a density of $10^{18}$ cm$^{-3}$ is formed.

Additionally, an n-type ohmic electrode 307 is formed in a region of the optical guide layer 302 where no photoabsorption layer is formed, and a p-type ohmic electrode 308 is formed on the cladding layer 306.

In this semiconductor waveguide photodetector, the optical guide layer 302, the lower photoabsorption layer 303, the upper photoabsorption layer 304, the optical guide layer 305, and the cladding layer 306 form a ridge structure 100 μm long and 30 μm wide. This ridge structure has an optical waveguide structure having core layers formed by stacking the lower and upper photoabsorption layers 303 and 304.

Incident light from the cleaved end face is gradually O/E-converted by the photoabsorption layers while being guided in the waveguide photodetector.

A band structure from the optical guide layer 302 to the optical guide layer 305 in the above structure is as shown in a band diagram of FIG. 3B. In the waveguide photodetector of this third embodiment, the lower photoabsorption layer 303 has a thickness of 1.5 μm and an n-type low carrier density, so the whole layer is depleted even when driven with a low voltage of 1 V. Accordingly, carriers produced by O/E conversion in the lower photoabsorption layer 303 and contributing to an O/E-converted current move at a drift speed and can respond at a high speed.

Also, since the upper photoabsorption layer 304 is made from a p-type semiconductor, the response of minority carriers produced by O/E conversion is dominated by the diffusion rate of electrons. The diffusion rate of electrons is not less than one order of magnitude higher than the diffusion rate of holes, and this allows electrons to respond at a high speed. This is the same as in the waveguide photodetectors according to the first and second embodiments described above.

Additionally, in the waveguide photodetector according to the third embodiment, the impurity density gradient is formed in the upper photoabsorption layer 304. Consequently, an electric field is formed upward in the upper photoabsorption layer 304. That is, a region wherein electrons drift toward the optical guide layer 302 is also formed in the upper photoabsorption layer 304. Then, electrons as minority carriers are accelerated in the upper photoabsorption layer 304 and this allows them to respond at a higher speed.

More specifically, all carriers produced in the photoabsorption layers can respond at a high speed. This permits the semiconductor waveguide photodetector of the third embodiment to receive optical signals at a higher speed than in the first embodiment described above.

In the third embodiment, the cleavage surface is used as the light incident end face as in the previous embodiments. However, a similar effect can be expected even when a surface formed by etching is used as the light incident end face.

Fourth Embodiment

A ridge structure is formed in each of the first to third embodiments described above, but the present invention is not limited to this structure.

Figure 4:
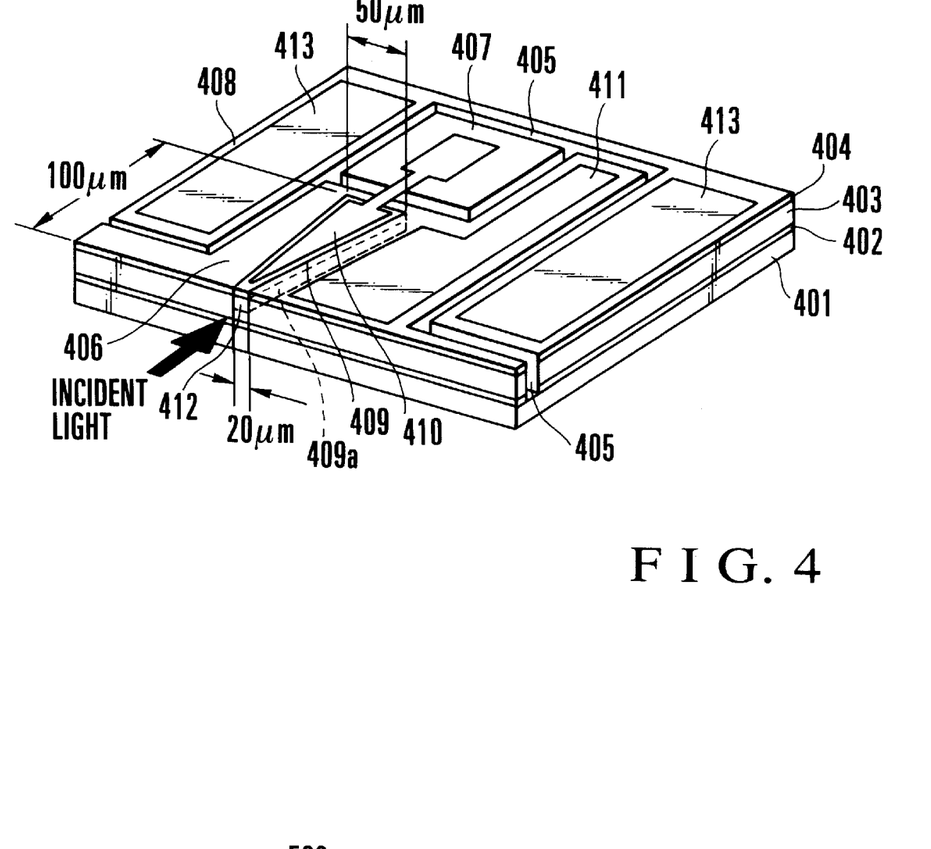
FIG. 4 is a perspective view showing the structure of a semiconductor photodetector according to the fourth embodiment of the present invention.

FIG. 4 shows the structure of a semiconductor photodetector according to the fourth embodiment of the present invention.

In this fourth embodiment, a 2-μm thick n-type InGaAsP cladding layer 402 having a band gap wavelength of 1.2 μm is formed on an Fe-doped semi-insulating InP substrate 401. This cladding layer 402 is made an n-type by doping silicon at a density of $10^{18}$ cm$^{-3}$.

A 3-μm thick n-type InGaAsP semiconductor layer 403 having a band gap wavelength of 1.4 μm and a lower carrier density is formed on the cladding layer 402. A 2-μm thick n-type InGaAsP cladding layer 404 having a band gap wavelength of 1.2 μm and a low carrier density is formed on the semiconductor layer 403. These layers can be grown by, e.g., MOVPE.

In this semiconductor waveguide photodetector, a trench 405 is formed to separate a device region 406, an electrode region 407, and a fixing region 408. Although this trench 405 can also be omitted, the performance of the device can be improved when the trench 405 is formed.

In the device region 406, a planar waveguide 409 is formed by selectively doping a p-type impurity such as Zn. In this planar waveguide 409, the p-type impurity is so doped as to spread to the center of the semiconductor layer 403. The semiconductor layer 403 of this planar waveguide 409 serves as a light absorption layer 409a.

A p-type ohmic electrode 410 is formed across the planar waveguide 409 and the electrode region 407. An n-type ohmic electrode 411 is formed on the other side of the device region 406. Note that the trench 405 is not formed on the side of a light incident surface 412 so that the light incident surface 412 is well formed by cleavage. Additionally, a metal film 413 for fixing by soldering is formed on the fixing region 408.

That is, in this fourth embodiment, no ridge structure is formed, and a region equivalent to a photoabsorption layer is formed by selectively doping an impurity into a predetermined region. In the fourth embodiment, photoabsorption layers are the region of the semiconductor layer 403 into which the p-type impurity is doped and the region below that region. That is, the upper-half region of the semiconductor layer 403 in the planar waveguide 409 is equivalent to the upper photoabsorption layer in the first to third embodiments. The lower-half region of the semiconductor layer 403 is equivalent to the lower photoabsorption layer in the first to third embodiments. The upper photoabsorption layer is a p-type region, and the lower photoabsorption layer maintains a low carrier density of the semiconductor layer 403.

In this fourth embodiment, therefore, the photodetector can be manufactured more easily because no ridge structure needs to be formed. That is, the formation of a ridge structure requires sophisticated technologies such as dry etching, and the yield and productivity of the structure are not so high. Conversely, the planar waveguide 409 of this embodiment can be readily formed by the impurity diffusion technique which is highly reproducible and productive. This fourth embodiment also has an effect analogous to the effect of the semiconductor waveguide photodetector of the first embodiment described earlier; that is, it was possible to receive an optical signal with a frequency of 1 GHz at an O/E conversion efficiency of about 80% upon application of a bias voltage of 1 V.

Additionally, in the fourth embodiment the planar waveguide 409 including the light absorption layer 409a 100 μm in length is formed to be tapered so that the width increases from 20 μm to 50 μm from the light incident surface 412. This tapered shape agrees with the spread, calculated by a beam propagation method, of light guided through the planar waveguide 409. As a consequence, the junction capacitance can be reduced to, e.g., 0.5 pF. Note that the planar waveguide 409 need not be formed into a taper shape, but may be, for example, formed to have a predetermined width depending on required specifications because the frequency band of receivable light is not greatly narrowed, although the capacitance increases to some extent.

In this fourth embodiment, as in the second embodiment described previously, the wavelength at the light absorption edge of the semiconductor layer 403 may be decreased upward in the direction of thickness. Also, as in the third embodiment described above, the impurity density in the semiconductor layer 403 of the planar 409 may be decreased downward in the direction of thickness.

In the above description, the thickness of the photoabsorption layers is 1.5+1.5=3 μm. However, the thickness is not limited to this value, and the total thickness of the photoabsorption layers need only be 2 μm or more. If the total thickness of the photoabsorption layers is smaller than 2 μm, it becomes impossible to stably obtain a necessary O/E conversion efficiency of 75%. Also, the n-type lower photoabsorption layer preferably has a thickness with which the whole layer is depleted when applied with a reverse bias voltage of 2 V. This is so because if the lower layer is thicker than this thickness, a voltage higher than 2 V is necessary to operate the photodetector and this increases the consumption power.

As has been described above, a semiconductor photodetector of the present invention comprises a photoabsorption layer having an n-type first layer and a p-type second layer formed in contact with the first layer, an n-type first semiconductor layer arranged on the side of the first layer and having a shorter wavelength at a light absorption edge and a lower refractive index than in the photoabsorption layer, and a p-type second semiconductor layer arranged on the side of the second layer and having a shorter wavelength at a light absorption edge and a lower refractive index than in the photoabsorption layer, wherein when a predetermined reverse bias voltage is applied between the first and second semiconductor layers, the first layer is entirely depleted and the second layer is partially depleted.

In this structure, the first layer is entirely depleted when a predetermined voltage is applied, and this increases the moving velocity of even holes. Additionally, although the second layer is not entirely depleted, minority carriers in the layer are electrons, so the moving velocity of photo-excited carriers is equivalent to the diffusion rate of electrons. Consequently, the photodetector can respond to high-speed optical signals without decreasing the O/E conversion efficiency even when driven with a low voltage of about 1 V.

In this semiconductor photodetector, the wavelength at a light absorption edge of the second layer decreases away from the first layer in the direction of thickness.

In this structure, the gradient of a band gap is formed in the second layer. This can make the velocity at which carriers (electrons) move to the first layer higher than the diffusion rate of the electrons. Consequently, the photodetector can respond to high-speed optical signals without decreasing the O/E conversion efficiency even when driven with a low voltage of about 1 V.

Also, in this semiconductor photodetector, the impurity density in the second layer increases away from the first layer in the direction of thickness.

In this structure, an electric field is formed by the gradient of the impurity density even in an undepleted region of the second layer. This can make the velocity at which carriers (electrons) move to the first layer higher than the diffusion rate of the electrons. Consequently, the photodetector can respond to high-speed optical signals without decreasing the O/E conversion efficiency even when driven with a low voltage of about 1 V.

Furthermore, in this semiconductor photodetector, side surfaces except a light incident end face of the second layer are covered with a third layer of n-type made from the same material as the second layer, side surfaces except the light incident end face of the second semiconductor layer are covered with a fourth layer of n-type made from the same material as the second semiconductor layer, and the second layer and the second semiconductor layer are gradually widened in a light guiding direction from the light incident end face.

This structure can be manufactured easily. Since the waveguide is widened in the guiding direction, the junction capacity can be decreased. Consequently, the photodetector can respond to high-speed optical signals without decreasing the O/E conversion efficiency even when driven with a low voltage of about 1 V.

What is claimed is:

1. A semiconductor photodetector comprising:
   a photoabsorption layer having an n-type first layer, and a p-type second layer formed in contact with said n-type first layer, said photoabsorption layer having a thickness of no less than 2 μm;
   a n-type first semiconductor layer arranged on a side of said n-type first layer and having a shorter wavelength at a light absorption edge and a lower refractive index than in said photoabsorption layer; and
   a p-type second semiconductor layer arranged on a side of said p-type second layer and having a shorter wavelength at a light absorption edge and a lower refractive index than in said photoabsorption layer,
   wherein said n-type first layer having a thickness such that when a reverse bias voltage is applied between said n-type first and said p-type second semiconductor layers, said n-type first layer is entirely depleted and said p-type second layer is partially depleted, said thickness of said n-type first layer made according to said reverse bias voltage to be applied, said reverse bias voltage having a value of no more than 2V.

2. A photodetector according to claim 1, wherein the wavelength at a light absorption edge of said second layer decreases away from said first layer in a direction of thickness.

3. A photodetector according to claim 1, wherein an impurity density in said second layer increases away from said first layer in a direction of thickness.

4. A photodetector according to claim 1, wherein
   side surfaces except a light incident end face of said second layer are covered with a third layer of n-type made from the same material as said second layer,
   side surfaces except the light incident end face of said second semiconductor layer are covered with a fourth layer of n-type made from the same material as said second semiconductor layer, and
   said second layer and said second semiconductor layer are gradually widened in a light guiding direction from the light incident end face.

5. A photodetector according to claim 4, wherein the wavelength at a light absorption edge of said second layer decreases away from said first layer in a direction of thickness.

6. A photodetector according to claim 4, wherein an impurity density in said second layer increases away from said first layer in a direction of thickness.

* * * * *